(12) United States Patent
Ding et al.

(10) Patent No.: US 10,949,025 B2
(45) Date of Patent: Mar. 16, 2021

(54) OPTICAL TOUCH DEVICE, DISPLAY AND ELECTRONIC DEVICE

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Wei Liu, Beijing (CN); Chih-Jen Cheng, Beijing (CN); Pengpeng Wang, Beijing (CN); Xueyou Cao, Beijing (CN); Ping Zhang, Beijing (CN); Chun-Wei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 347 days.

(21) Appl. No.: 16/060,886

(22) PCT Filed: Nov. 30, 2017

(86) PCT No.: PCT/CN2017/113897
§ 371 (c)(1),
(2) Date: Jun. 8, 2018

(87) PCT Pub. No.: WO2018/218910
PCT Pub. Date: Dec. 6, 2018

(65) Prior Publication Data
US 2020/0285343 A1   Sep. 10, 2020

(30) Foreign Application Priority Data

May 27, 2017   (CN) .......................... 201710388713.3

(51) Int. Cl.
*G06F 3/041*   (2006.01)
*G06F 3/042*   (2006.01)
*H01L 27/32*   (2006.01)

(52) U.S. Cl.
CPC .......... *G06F 3/0421* (2013.01); *G06F 3/0412* (2013.01); *G06F 3/0416* (2013.01);
(Continued)

(58) Field of Classification Search
CPC .... G06F 3/0421; G06F 3/0416; G06F 3/0412; H01L 27/323; H01L 27/3211; H01L 27/3276; H01L 27/3232; H01L 27/32
See application file for complete search history.

(56) References Cited

U.S. PATENT DOCUMENTS

2007/0090276 A1*  4/2007  Peng ..................... G01J 1/1626
                                                     250/214.1
2008/0297487 A1* 12/2008  Hotelling .............. G06F 3/0416
                                                     345/173

(Continued)

FOREIGN PATENT DOCUMENTS

| CN | 101887691 A | 11/2010 |
| CN | 103558952 A | 2/2014 |
| CN | 104009067 A | 8/2014 |

OTHER PUBLICATIONS

First Office Action for CN Application No. 201710388713.3, dated May 7, 2019.

(Continued)

*Primary Examiner* — Adam J Snyder
(74) *Attorney, Agent, or Firm* — Dinsmore & Shohl LLP

(57) ABSTRACT

The present disclosure provides an optical touch device and a manufacturing method thereof, a display and an electronic device, wherein the optical touch device comprises: a pixel array (11) that comprises a plurality of pixel sub-circuits (101) each of which comprises M first pixels (1011) and N second pixels (1012), wherein detection rays with a preset frequency are emitted by the second pixels (1012), where M and N are positive integers; a light receiving array (12) that comprises a plurality of light receivers (121) corresponding, (Continued)

at a one-to-one basis, to the plurality of pixel sub-circuits (101), wherein each of the light receivers (121) generates an sensing signal by receiving reflected rays of the detection rays emitted by a corresponding second pixel (1012); and a detection circuit (13) connected with the plurality of light receivers (121), wherein the detection circuit (13) performs touch positioning.

14 Claims, 3 Drawing Sheets

(52) U.S. Cl.
CPC ........ *H01L 27/323* (2013.01); *H01L 27/3211* (2013.01); *H01L 27/3232* (2013.01); *H01L 27/3276* (2013.01); *H01L 27/32* (2013.01)

(56) References Cited

U.S. PATENT DOCUMENTS

| | | | | |
|---|---|---|---|---|
| 2013/0125085 A1* | 5/2013 | Shimizu | ............... | G06F 30/36 |
| | | | | 716/139 |
| 2015/0364107 A1* | 12/2015 | Sakariya | ............... | G06F 3/042 |
| | | | | 345/174 |
| 2017/0142805 A1* | 5/2017 | Sakaguchi | ........... | G09G 3/3208 |

OTHER PUBLICATIONS

International Search Report and Written Opinion for International Appl. No. PCT/CN2017/102480, dated Mar. 8, 2018.

* cited by examiner

OPTICAL TOUCH DEVICE, DISPLAY AND ELECTRONIC DEVICE

CROSS-REFERENCE TO RELATED APPLICATIONS

The present patent application is a U.S. National Stage under 35 U.S.C. § 371 of International Application No. PCT/CN2017/113897, as filed on Nov. 30, 2017, which claims the priority to Chinese Patent Application No. 201710388713.3 filed on May 27, 2017. The disclosure of each of these applications is hereby fully incorporated herein by reference in its entirety.

TECHNICAL FIELD

This disclosure relates to an optical touch device and a manufacturing method thereof, a display and an electronic device.

BACKGROUND

In the related arts, optical touch technologies based on OLED (Organic Light-Emitting Diode) have been widely used.

SUMMARY

An illustrative embodiment of this disclosure proposes an optical touch device comprising: a pixel array that comprises a plurality of pixel sub-circuits each of which comprises M first pixels and N second pixels, wherein detection rays with a preset frequency are emitted by the N second pixels, where M and N are positive integers; a light receiving array that comprises a plurality of light receivers corresponding, at a one-to-one basis, to the plurality of pixel sub-circuits, wherein each of the light receivers generates an sensing signal by receiving reflected rays of the detection rays emitted by a corresponding second pixel; and a detection circuit connected with the plurality of light receivers, wherein the detection circuit performs touch positioning according to the sensing signal generated by each of the light receivers.

According to an illustrative embodiment of this disclosure, the optical touch device further comprises: a first control signal line connected with the M first pixels, the first control signal line driving the M first pixels by outputting a first drive signal; and a second control signal line connected with the N second pixels, the second control signal line driving the N second pixels to emit the detection rays with the preset frequency by outputting a second drive signal.

According to an illustrative embodiment of this disclosure, the plurality of light receivers are divided into P groups of light receiving sub-circuits, each group of light receiving sub-circuits comprises at least one of the light receivers, and each group of light receiving sub-circuits comprises a first output end and a second output end, where P is an integer greater than 1.

According to an illustrative embodiment of this disclosure, the detection circuit further comprises P detection sub-circuits, each of which is connected, via a transistor, with a corresponding light receiving sub-circuit in the P groups of light receiving sub-circuits.

According to an illustrative embodiment of this disclosure, the detection circuit further comprises a demodulator, and each of the P detection sub-circuits comprises a first input end, a second input end and an output end, wherein the first input end of each of the P detection sub-circuits is connected, via a transistor, with the first output end of the corresponding light receiving sub-circuit; the second input end of each of the P detection sub-circuits is connected with the second output end of the corresponding light receiving sub-circuit, and the second input end of each of the P detection sub-circuits is further connected with the second control signal line; and the output end of each of the P detection sub-circuits is connected with the demodulator.

According to an illustrative embodiment of this disclosure, each of the P detection sub-circuits comprises: a first amplifier, an inverting end of which is connected, via a transistor, with the first output end of the corresponding light receiving sub-circuit, an non-inverting end of which is connected with the second output end of the corresponding light receiving sub-circuit, the non-inverting end of which is further connected with the second control signal line, and the output end of which is connected with the demodulator; and a first resistor, one end of which is connected with the inverting end of the first amplifier, and the other end of which is connected with the output end of the first amplifier.

According to an illustrative embodiment of this disclosure, each of the P detection sub-circuits further comprises a subtractor connected between the output end of the first amplifier and the demodulator to filter out the second drive signal.

According to an illustrative embodiment of this disclosure, the subtractor comprises: a second resistor one end of which is connected with the output end of the first amplifier; a third resistor one end of which is connected with the other end of the second resistor and comprises a first node, and the other end of which is grounded; a four resistor one end of which is connected with the second control signal line; a fifth resistor one end of which is connected with the other end of the fourth resistor and comprises a second node; a second amplifier an non-inverting end of which is connected with the first node, and an inverting end of which is connected with the second node, and an output end of which is connected with the other end of the fifth resistor and the demodulator respectively.

According to an illustrative embodiment of this disclosure, the M first pixels include R pixels, G pixels, and B pixels, and the N second pixels include infrared pixels.

According to an illustrative embodiment of this disclosure, the light receiver comprises a photosensitive diode, and when each group of the light receiving sub-circuits comprises a plurality of photosensitive diodes, anodes of the plurality of photosensitive diodes are connected together and cathodes of the plurality of photosensitive diodes are connected together.

An illustrative embodiment of this disclosure proposes a display comprising the optical touch device.

An illustrative embodiment of this disclosure proposes an electronic device comprising the display.

An illustrative embodiment of this disclosure proposes a method of manufacturing the optical touch device.

DETAILED DESCRIPTION

Figure 1:
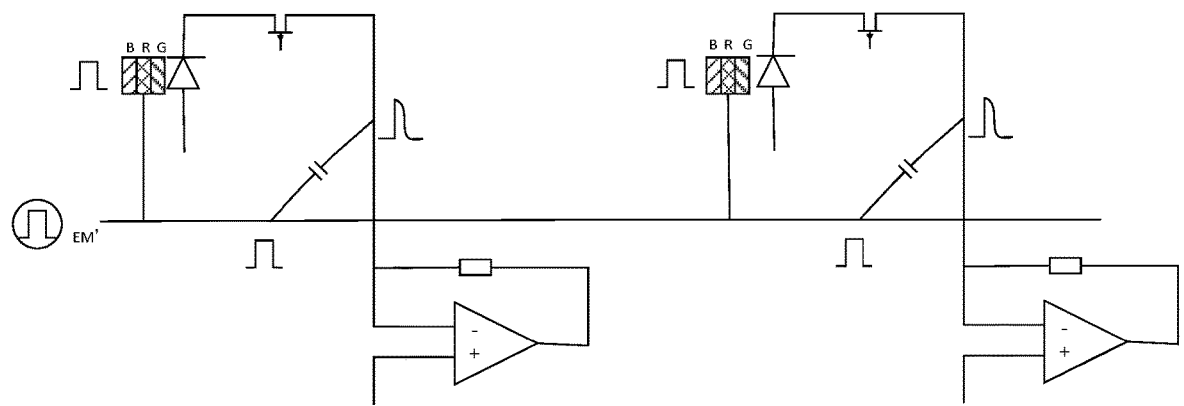
FIG. 1 is a schematic diagram showing a circuit of an optical touch device in the related arts.

The embodiments of present disclosure will be described in detail below, and examples of the embodiments are shown in the accompanying drawings, wherein throughout, the same or similar reference numerals refer to the same or similar elements or elements having the same or similar functions. The embodiments described with reference to the accompanying drawings below are illustrative, only serve to explain the present disclosure, and cannot be construed as limiting the present disclosure.

As shown in FIG. 1, the optical touch technologies based on OLED (Organic Light-Emitting Diode) mostly adopt the capacitive schemes, and utilizes the modulation light technology for realizing optical touch, i.e., controlling the OLED to switch between bright and dark at a certain frequency through the modulation of the EM signal, and detecting the light with a fixed frequency through the back-end demodulation, so as to realize optical touch, thereby reducing the outside ambient light interference.

However, the related arts have the following problems: firstly, OLED materials can hardly withstand high temperature, and it is very hard to integrate the touch sensor; and secondly, the EM' signal may be coupled to the reading lines, and has the same frequency with the light signal, which results in great interference to the back-end detection, and a serious coupling will even result in a larger overshoot on the front end of the operational amplifier and thus causing saturation. Moreover, a different display picture will result in a different brightness of the light source, thereby resulting in difficulties in detection, as a result that the light modulation mode is difficult to be integrated into the display.

In the optical touch device proposed according to an illustrative embodiment of this disclosure, detection rays with a preset frequency are emitted by the second pixels, each light receiving sub-circuit generates an sensing signal by receiving reflected rays of detection rays emitted by a corresponding second pixel, and the detection circuit performs touch positioning according to the sensing signal generated by each light receiving sub-circuit, thereby realizing integration of display and optical touch to attain a higher integration level.

According to an illustrative embodiment of this disclosure, the optical touch device further comprises: a first control signal line connected with the first pixels, the first control signal line driving the first pixels by outputting a first drive signal; and a second control signal line connected with the second pixels, the second control signal line driving the second pixels to emit the detection rays with the preset frequency by outputting a second drive signal, therefore, signal coupling can be avoided, thereby effectively suppressing interference and improving detection accuracy.

The display proposed according to an illustrative embodiment of this disclosure can realize integration of display and optical touch, to attain a higher integration level.

The electronic device proposed according to an illustrative embodiment of this disclosure can realize integration of display and optical touch, to attain a higher integration level.

The optical touch device, display, and electronic device according to the illustrative embodiments of this disclosure will be described below with reference to the accompanying drawings.

Figure 2:
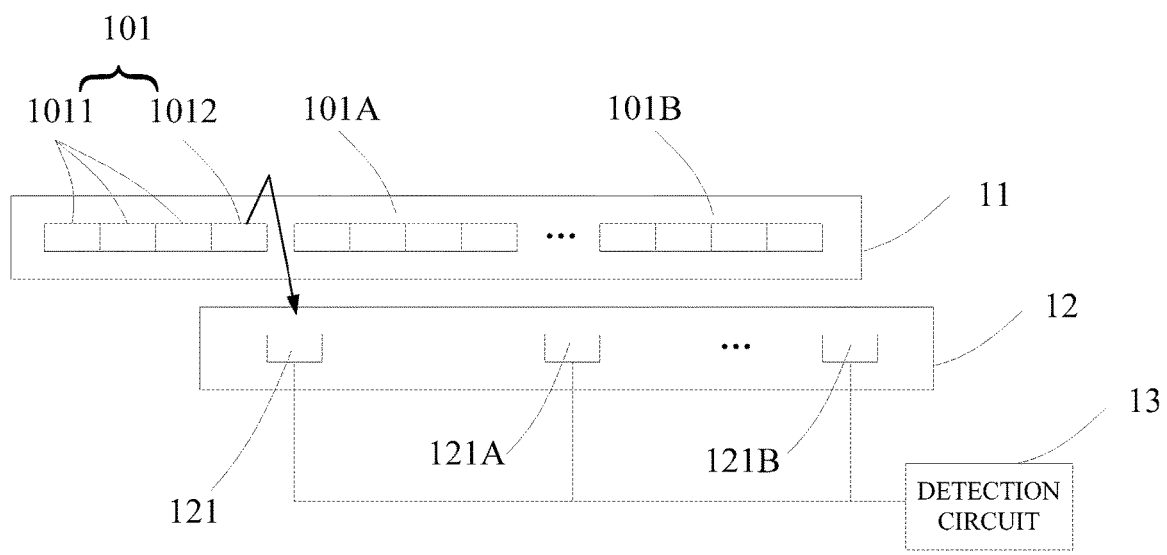
FIG. 2 is a schematic diagram showing a structure of an optical touch device according to an illustrative embodiment of the present disclosure.
Figure 3:
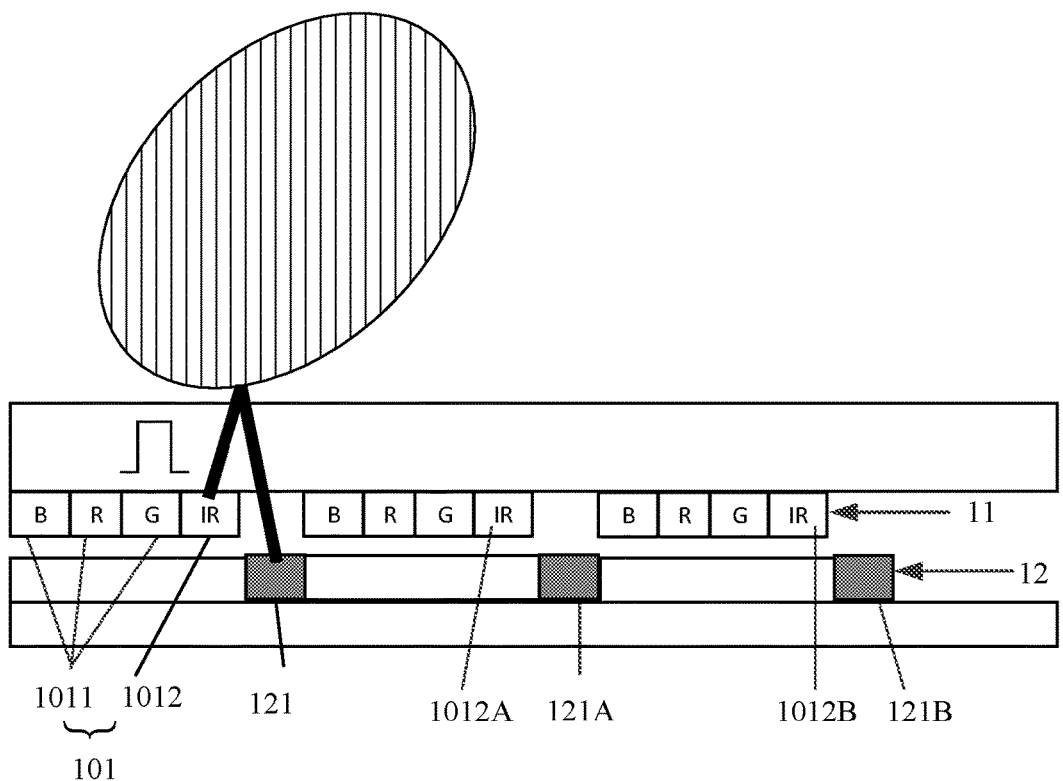
FIG. 3 is a schematic diagram showing a principle of an optical touch device according to an illustrative embodiment of the present disclosure.
Figure 4:
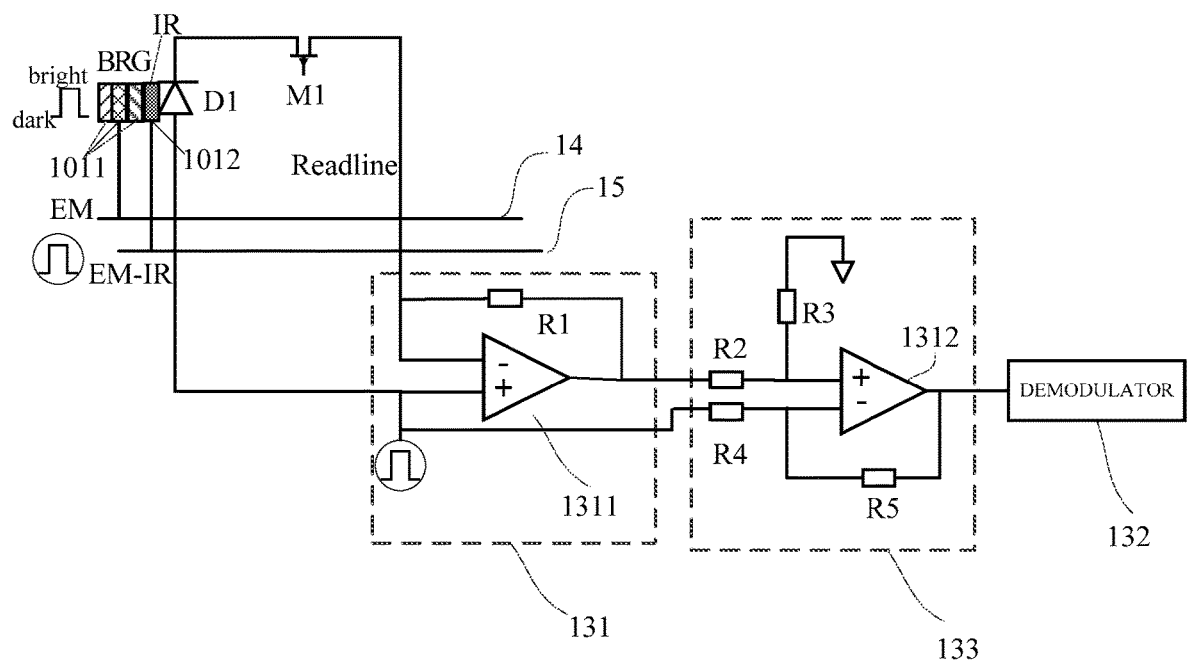
FIG. 4 is a schematic diagram showing a circuit of an optical touch device according to an illustrative embodiment of the present disclosure.

FIG. 2 is a schematic diagram showing a structure of an optical touch device according to an illustrative embodiment of this disclosure. As shown in FIGS. 2-4, the optical touch device comprises: a pixel array 11, a light receiving array 12, and a detection circuit 13.

As shown in FIGS. 2-4, the pixel array 11 comprises a plurality of pixel sub-circuits 101 each comprising M first pixels 1011 and N second pixels 1012, among which, an image is generated by the M first pixels 1011, and detection rays with a preset frequency are emitted by the N second pixels 1012, where M and N are positive integers.

As shown in FIGS. 2-4, the light receiving array 12 comprises a plurality of light receivers 121 corresponding, at a one-to-one basis, to a plurality of pixel sub-circuits 101, that is, each of the plurality of light receivers 121 corresponds to a corresponding one of the plurality of pixel sub-circuits 101 respectively. For example, the light receiver 121A corresponds to the pixel sub-circuit 101A, the light receiver 121B corresponds to the pixel sub-circuit 101B, and so on. Each light receiver 121 generates an sensing signal by receiving reflected rays of the detection rays emitted by the second pixel 1012 in the corresponding pixel sub-circuit 101.

In other words, the light receiver 121 can be arranged corresponding to the second pixel 1012, detection rays can be emitted by the second pixel 1012, the detection rays emitted by the second pixel 1012 will be reflected when encountering an obstacle (e.g., fingers), and the light receiver 121 can receive the reflected detection rays.

For example, as shown in FIG. 3, the light receiver 121A corresponds to the second pixel 1012A, the light receiver 121B corresponds to the second pixel 1012B, the detection rays emitted by the second pixel 1012A are reflected and then received by the light receiver 121A, and the detection rays emitted by the second pixel 1012B are reflected and then received by the light receiver 121B.

As shown in FIGS. 2-4, the detection circuit 13 is connected with the plurality of light receivers 121, and the detection circuit 13 performs touch positioning according to the sensing signal generated by each light receiver 121.

That is to say, the detection circuit 13 can detect an output signal of each light receiver 121, each light receiver 121 generates the sensing signal after receiving the reflected detection rays, the frequency of the sensing signal is identical with the frequency of detection rays, and after the detection circuit 13 detects the sensing signal with the corresponding frequency, the touch positioning can be performed at the position where the light receiver 121 that generates the sensing signal with the corresponding frequency is located.

In other words, when the user's finger touches a position, the detection rays with the preset frequency emitted by the second pixel 1012 in the pixel sub-circuit 101 corresponding to the position will be reflected by the user's finger, the light receiver 121 corresponding to the position receives the reflected rays with the preset frequency and generates an sensing signal, and the detection circuit 13 can detect that the light receiver 121 corresponding to the position generates the sensing signal, therefore, it can be determined that the user's finger touches the position and touch positioning is realized.

For example, according to an illustrative embodiment of this disclosure, the M first pixels 1011 correspondingly have M colors. In other words, each pixel sub-circuit 101 can include M different colors of the first pixels 1011. For example, as shown in FIGS. 3 and 4, the M first pixels 1011 may include R (red) pixel, G (green) pixel, and B (blue) pixel, and the N second pixels 1012 include infrared pixels. Note that the infrared pixels described herein refer to pixels that can emit infrared rays. That is to say, M=3, N=1, each pixel sub-circuit 101 may include R pixel, G pixel and B pixel, and an infrared pixel. Each pixel sub-circuit 101 can generate an image by the R pixel, the G pixel, and the B pixel, and emit infrared rays by the infrared pixel.

For example, in an illustrative embodiment of this disclosure, an infrared pixel is added on the basis of the R pixel, the G pixel, and the B pixel to construct the pixel sub-circuit 101, wherein the R pixel, the G pixel and B pixel as well as the infrared pixel can be driven by a pixel drive circuit. By modulating the drive signal with the frequency of the infrared rays and applying the modulated drive signal to the infrared pixel, the infrared pixel can emit infrared rays. After the infrared rays irradiate the finger, they are reflected by the finger and then absorbed by the corresponding light receiver 121, and the detection circuit 13 performs touch positioning according to whether or not the light receiver 121 absorbs the light.

For example, according to an illustrative embodiment of this disclosure, as shown in FIG. 4, the optical touch device further comprises a first control signal line 14 and a second control signal line 15, wherein the first control signal line 14 is connected with the first pixel 1011 and drives the first pixel 1011 by outputting a first drive signal EM; and the second control signal line 15 is connected with the second pixel 1012, and drives the second pixel 1012 to emit the detection rays with the preset frequency by outputting a second drive signal EM-IR.

That is to say, the M first pixels 1011 in each pixel sub-circuit 101 can be driven by the first drive signal EM outputted by the first control signal line 14, and the N second pixels 1012 in each pixel sub-circuit 101 can be driven by the second drive signal EM-IR outputted by the second control signal line 15. For example, for the R Pixel, the G pixel and the B pixel, as well as the infrared pixel, the R Pixel, the G pixel and the B pixel can be driven by the first drive signal EM outputted by the first control signal line 14, and the infrared pixel can be driven by the second drive signal EM-IR outputted by the second control signal line 15. Therefore, R pixel, G pixel, B pixel and the infrared pixel adopt two different drive signals, which can avoid signal coupling, thereby effectively suppressing interference and improving the detection accuracy.

It should be noted that, the R pixels, the G pixels and the B pixels in different pixel sub-circuits can be driven by different first drive signals EM; or the R pixels, the G pixels and the B pixels of the pixel sub-circuits in the same row can be driven by the same first drive signal EM, and the R Pixels, the G Pixels and the B pixels of pixel sub-circuits in different rows can be driven by different first drive signals EM. Similarly, infrared pixels in different pixel sub-circuits can be driven by different second drive signals EM-IR; or the infrared pixels of pixel sub-circuits in the same row can be driven by the same second drive signal EM-IR, while the infrared pixels of pixel sub-circuits in different rows can be driven by different second drive signals EM-IR.

For example, according to an illustrative embodiment of this disclosure, the plurality of light receivers 121 can be divided into P groups of light receiving sub-circuits each comprising at least one light receiver 121. For example, Q light receivers 121 within a preset area can be grouped into a group of light receiving sub-circuits, whereby, among the plurality of light receivers 121, every Q light receivers 121 are grouped into a light receiving sub-circuit to obtain P groups of light receiving sub-circuits, where P is an integer greater than 1, and q is a positive integer.

For example, the preset range of area can be a range of 4 mm*4 mm, that is, the light receivers 121 on the entire screen can be divided into approximately P 4 mm*4 mm sub-arrays, i.e., P groups of light receiving sub-circuits.

Figure 5:
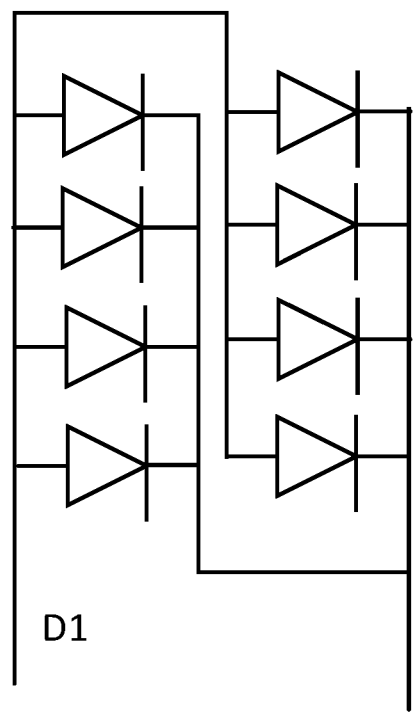
FIG. 5 is a schematic diagram showing a circuit of a light receiving sub-circuit in an optical touch device according to an illustrative embodiment of the present disclosure.

For example, according to an illustrative embodiment of this disclosure, the light receiver 121 may include a photosensitive diode. When each group of light receiving sub-circuits comprises a plurality of photosensitive diodes, the plurality of photosensitive diodes D1 can be connected in parallel, for example, anodes of the plurality of photosensitive diodes D1 are connected together, and cathodes of the plurality of photosensitive diodes D1 are connected together. For example, as shown in FIG. 5, each group of light receiving sub-circuits can comprise 8 photosensitive diodes D1, wherein anodes of the 8 photosensitive diodes D1 are connected together, and cathodes of the 8 photosensitive diodes D1 are connected together. In this way, the plurality of photosensitive diodes are connected in parallel, to increase the photocurrent.

According to an illustrative embodiment of this disclosure, each group of light receiving sub-circuits may comprise a first output end and a second output end, and as shown in FIG. 5 and FIG. 4, cathodes of the one or more photosensitive diode D1 can serve as the first output end of each group of light receiving sub-circuits, and anodes of the one or more photosensitive diodes D1 can serve as the second output end of each group of light receiving sub-circuits.

As shown in FIG. 4, the detection circuit 13 comprises P detection sub-circuits 131 corresponding to the P groups of light receiving sub-circuits 131, wherein each detection sub-circuit in the P detection sub-circuits 131 is connected, via a transistor M1, with a corresponding light receiving sub-circuit in the P groups of light receiving sub-circuits, where p is an integer greater than 1. The detection circuit 13 further comprises a demodulator 132. Each detection sub-circuit 131 comprises a first input end, a second input end and an output end, the first input end of each detection sub-circuit 131 is connected, via the transistor M1, with the first output end (e.g., the cathode of the photosensitive diode D1) of the corresponding light receiving sub-circuit, the second input end of each detection sub-circuit 131 is connected with the second output end (e.g., the anode of the photosensitive diode D1) of the corresponding light receiving sub-circuit, the second input end of each detection sub-circuit 131 is also connected with the second control signal line 15, and the output end of each detection sub-circuit 131 is connected with the demodulator 132, wherein the detection sub-circuit 131 is used for generating a detection signal according to the sensing signal outputted by the corresponding light receiving sub-circuit, and the demodulator 132 is used for demodulating the detection signal generated by the detection sub-circuit 131 to obtain touch positioning information.

For example, as shown in FIG. 4, a first end of the transistor M1 is connected with the first input end of the detection sub-circuit 131, a second end of the transistor M1 is connected with the first output end of the corresponding light receiving sub-circuit, and a control end of the transistor M1 is connected with a control signal receiving end to receive a control signal, and the transistor M1 is turned on or off according to the control signal, wherein, when the transistor M1 is turned on, the detection sub-circuit 131 can detect the sensing signal outputted by the light receiving sub-circuit; when the transistor M1 is turned off, the detection sub-circuit 131 cannot detect the sensing signal outputted by the light receiving sub-circuit output, that is, the transistor M1 can control the reading of the sensing signal.

For example, as shown in FIG. 4, each detection sub-circuit 131 comprises a first amplifier 1311 and a first resistor R1. An inverting end of the first amplifier 1311 is connected, via the transistor M1, with the first output end of the corresponding light receiving sub-circuit, an non-inverting end of the first amplifier 1311 is connected with the second output end of the corresponding light receiving sub-circuit, the non-inverting end of the first amplifier 1311 is further connected with the second control signal line 15, and an output end of the first amplifier 1311 is connected with the demodulator 132; one end of the first resistor R1 is connected with the inverting end of the first amplifier 1311, and the other end of the first resistor R1 is connected with the output end of the first amplifier 1311.

That is to say, the light receivers 121 on the entire screen are divided into approximately P 4 mm*4 mm sub-arrays, i.e., p groups of light receiving sub-circuits. In each sub array, the cathodes of the photosensitive diodes D1 are connected, via the transistor M1, with the inverting end of the first amplifier 1311, and the anodes of the photosensitive diodes D1 are connected with the non-inverting end of the first amplifier 1311.

For example, as shown in FIG. 4, the detection circuit 31 further comprises a subtractor 133 connected between the output end of the first amplifier 1311 and the demodulator 132, to filter out the second drive signal. For example, the subtractor 133 comprises a second resistor R2, a third resistor R3, a fourth resistor R4, a fifth resistor R5 and a second amplifier 1312.

One end of the second resistor R2 is connected with the output end of the first amplifier 1311; one end of the third resistor R3 is connected with the other end of the second resistor R2 and comprises a first node, the other end of the third resistor R3 is grounded; one end of the resistor R4 is connected with the second control signal line 15; one end of the resistor R5 is connected with the other end of the fourth resistor R4 and comprises a second node; the non-inverting end of the second amplifier 1312 is connected with the first node, the inverting end of the second amplifier 1312 is connected with the second node, and the output end of the second amplifier 1312 is connected with the other end of the fifth resistor R5 and the demodulator 132 respectively.

For example, in an illustrative embodiment of this disclosure, the first drive signal EM outputted by the first control signal line 14 controls brightness and darkness of the M first pixels 1011 (i.e., R pixel, G pixel, and B pixel) to control the display to display an image. In addition, the second drive signal outputted by the second control signal line 15 separately controls the N second pixels 1012 (i.e., infrared pixels) to emit light. In this way, by applying the second drive signal EM-IR with the preset frequency f, infrared pixels can emit detection rays at the preset frequency f.

Additionally, the second control signal line 15 is connected with the non-inverting end of the first amplifier 1311 on the front end of the detection sub-circuit 131, and applies the second drive signal with the desired preset frequency f, and since at this time the signal readline outputted by the light receiving sub-circuit via the transistor M1 is identical with the second drive signal EM-IR, no coupling effect will occur, that is, no impact effect will occur to the detection front end, which solves the problem that the light modulation mode is difficult to be integrated into the display in the related arts.

In addition, by connecting the subtractor 133 after the first amplifier 1311, the superimposed second drive signal EM-IR is filtered out, and finally, the current signal which is generated by the light receivers receiving the irradiation of the infrared pixels with the preset frequency f enters the demodulator 132 and is demodulated, thereby completing the detection process to realize touch positioning.

Thus, in the illustrative embodiments of this disclosure, the R pixel, the G pixel, the B pixel and the infrared pixel adopt two different drive signals, both ends of the light receiving sub-circuit are connected to the non-inverting end and the inverting end of the first amplifier 131 on the front end of the detection circuit 13, and a drive signal with the same frequency as the second drive signal EM-IR is simultaneously applied, which effectively eliminates the interference generated by the driving of the second drive signal EM-IR, and realizes optical touch on the OLED display.

According to an illustrative embodiment of this disclosure, a second pixel (i.e., infrared pixel) can be integrated on the backplane of the display (such as an OLED display), and a light receiver (i.e., photosensitive diode) is also integrated on the backplane. For example, the detection circuit 13 can be arranged in the integrated circuit IC, and the pixel array 11, light receiving array 12 and transistor M1 can be integrated in the screen panel.

In summary, in the optical touch device proposed according to the illustrative embodiment of this disclosure, detection rays with a preset frequency are emitted by the second pixels, each light receiving sub-circuit generates an sensing signal by receiving reflected rays of detection rays emitted by a corresponding second pixel, and the detection circuit performs touch positioning according to the sensing signal generated by each light receiving sub-circuit, thereby realizing integration of display and optical touch, to attain a higher integration level.

In addition, an illustrative embodiment of this disclosure further proposes a display comprising the optical touch device according to the above illustrative embodiment.

The display proposed according to the illustrative embodiment of this disclosure can realize integration of display and optical touch, to attain a higher integration level.

Finally, an illustrative embodiment of this disclosure further proposes an electronic device comprising the display according to the above illustrative embodiment.

The electronic device proposed according to the illustrative embodiment of this disclosure can realize integration of display and optical touch, to attain a higher integration level.

In the description of this disclosure, it should be appreciated that, orientation or position relations indicated by the terms "center", "longitudinal", "lateral", "length", "width", "thickness", "up", "down", "front", "rear", "left", "right", "vertical", "horizontal", "top", "bottom", "inside", "outside", "clockwise", "counterclockwise", "axial", "radial", "circumferential" etc. are orientation or position relations shown based on the accompanying drawings, only for the sake of the description of this disclosure and simplified description, rather than indicating or implying that the device or component must have a specific orientation and is constructed and operated in the particular orientation, and thus cannot be construed as limiting this disclosure.

In addition, the terms "first" and "second" are only used for the sake of description and cannot be construed as indicating or implying a relative importance or implicitly indicating a number of the technical features. Thus, the features defined with "first" and "second" can comprise at least one of these features, either explicitly or implicitly. In the description of this disclosure, "a plurality of" means at least two, such as two, three, etc. unless expressly defined otherwise.

In this disclosure, unless expressly specified and defined otherwise, terms such as "installing", "connected", "connecting", "fixed" should be understood in a broad sense, for example, they may be a fixed connection, a detachable connection, or integrated; they may be a mechanical connection or electrical connection; they may be a direct connection, or an indirect connection through an intermediate medium, or internal communication between two components, or interactions between the two components, unless otherwise expressly defined. For those skilled in the art, exact meanings of the above terms in this disclosure can be understood according to specific circumstances.

In this disclosure, unless otherwise expressly specified and defined, the first feature "above" or "under" the second feature may be a direct contact of the first and second features, or indirect contact of the first and second features through the intermediary medium. Moreover, the first feature "over", "above" and "on" the second feature may be that the first feature is right above or obliquely above the second feature, or merely that the first feature has a level height higher than the second feature. The first feature "under", "below" and "beneath" the second feature may be that the first feature is right below or obliquely below the second feature, or merely that the first feature has a level height less than the second feature.

In the description of this disclosure, reference terms "one embodiment", "some embodiments", "examples", "illustrative examples", or "some examples" etc. mean that specific features, structures, materials, or characteristics described in combination with the embodiment or example are included in at least one embodiment or example of this disclosure. In the description, the illustrative representations of the above terms are not necessarily directed to the same embodiment or example. Furthermore, the specific features, structures, materials, or characteristics described can be combined in an appropriate manner in either one or more embodiments or examples. In addition, in the case without contradictions, those skilled in the art could combine and mix the different embodiments or examples described in the description with the features of the different embodiments or examples.

Although embodiments of the present disclosure have been shown and described above, it would be appreciated that, the embodiments are illustrative and cannot be construed as limiting the present disclosure, and various variations, modifications, replacements and variants may be made to the embodiments by those skilled in the art within the scope of the present disclosure.

What is claimed is:

1. An optical touch device comprising:
   a pixel array that comprises a plurality of pixel sub-circuits each of which comprises M first pixels and N second pixels, wherein the N second pixels are used for emitting detection rays with a preset frequency, where M and N are positive integers;
   a light receiving array that comprises a plurality of light receivers corresponding, on a one-to-one basis, to the plurality of pixel sub-circuits, wherein each of the light receivers generates an sensing signal by receiving reflected rays of the detection rays emitted by a corresponding second pixel;
   a detection circuit connected with the plurality of light receivers, for performing ouch positioning according to the sensing signal generated by each of the light receivers;
   a first control signal line connected with the M first pixels, the first control signal line driving the M first pixels by outputting a first drive signal; and
   a second control signal line connected with the N second pixels, the second control signal line driving the N second pixels to emit the detection rays with the preset frequency by outputting a second drive signal,
   wherein the plurality of light receivers are divided into P groups of light receiving sub-circuits, each group of light receiving sub-circuits comprises at least one of the light receivers, and each group of light receiving sub-circuits comprises a first output end and a second output end where P is an integer greater than 1,
   wherein the detection circuit comprises P detection sub-circuits, each of which is connected, via a transistor, with a corresponding light receiving sub-circuit in the P groups of light receiving sub-circuits,
   wherein each of the P detection sub-circuits comprises a first input end, a second input end and an output end,
   wherein the first input end of each of the P detection sub-circuits is connected, via the transistor, with the first output end of the corresponding light receiving sub-circuit, and
   wherein the second input end of each of the P detection sub-circuits is connected with the second output end of the corresponding light receiving sub-circuit and the second input end of each of the P detection sub-circuits is further connected with the second control signal line.

2. The optical touch device according to claim 1, wherein the detection circuit further comprises a demodulator, and the output end of each of the P detection sub-circuits is connected with the demodulator.

3. The optical touch device according to claim 2, wherein each detection sub-circuit comprises:
   a first amplifier, an inverting end of which is connected, via the transistor, with the first output end of the corresponding light receiving sub-circuit, an non-inverting end of which is connected with the second output end of the corresponding light receiving sub-circuit, the non-inverting end of which is further connected with the second control signal line, and an output end of which is connected with the demodulator; and
   a first resistor, one end of which is connected with the inverting end of the first amplifier, and other end of which is connected with the output end of the first amplifier.

4. The optical touch device according to claim 3, wherein each of the P detection sub-circuits further comprises a subtractor connected between the output end of the first amplifier and the demodulator to filter out the second drive signal.

5. The optical touch device according to claim 4, wherein the subtractor comprises:
   a second resistor one end of which is connected with the output end of the first amplifier;
   a third resistor one end of which is connected with other end of the second resistor and comprises a first node, and other end of which is grounded;
   a four resistor one end of which is connected with the second control signal line;
   a fifth resistor one end of which is connected with other end of the fourth resistor and comprises a second node;

a second amplifier, an non-inverting end of which is connected with the first node, and an inverting end of which is connected with the second node, and an output end of which is connected with other end of the fifth resistor and the demodulator respectively.

6. The optical touch device according to claim 1, wherein the M first pixels include R pixels, G pixels, and B pixels; and the N second pixels include infrared pixels.

7. The optical touch device according to claim 1, wherein each of the light receivers comprises a photosensitive diode, and when each of the P groups of light receiving sub-circuits comprises a plurality of photosensitive diodes, anodes of the plurality of photosensitive diodes are connected together and cathodes of the plurality of photosensitive diodes are connected together.

8. A display comprising an optical touch device, wherein the optical touch device comprises:
   a pixel array that comprises a plurality of pixel sub-circuits each of which comprises M first pixels and N second pixels, wherein the N second pixels are used for emitting detection rays with a preset frequency, where M and N are positive integers;
   a light receiving array that comprises a plurality of light receivers corresponding, on a one-to-one basis, to the plurality of pixel sub-circuits, wherein each of the light receivers generates an sensing signal by receiving reflected rays of the detection rays emitted by a corresponding second pixel;
   a detection circuit connected with the plurality of light receivers, for performing touch positioning according to the sensing signal generated by each of the light receivers;
   a first control signal line connected with the M first pixels, the first control signal line driving the M first pixels by outputting a first drive signal; and
   a second control signal line connected with the N second pixels the second control signal line driving the N second pixels to emit the detection rays with the preset frequency by outputting a second drive signal,
   wherein the plurality of light receivers are divided into P groups of light receiving sub-circuits, each group of light receiving sub-circuits comprises at least one of the light receivers, and each group of light receiving sub-circuits comprises a first output end and a second output end, where P is an integer greater than 1,
   wherein the detection circuit comprises P detection sub-circuits, each of which is connected, via a transistor, with a corresponding light receiving sub-circuit in the P groups of light receiving sub-circuits,
   wherein each of the P detection sub-circuits comprises a first input end, a second input end and an output end,
   wherein the first input end of each of the P detection sub-circuits is connected, via the transistor, with the first output end of the corresponding light receiving sub-circuit, and
   wherein the second input end of each of the P detection sub-circuits is connected with the second output end of the corresponding light receiving sub-circuit, and the second input end of each of the P detection sub-circuits is further connected with the second control signal line.

9. The display according to claim 8, wherein the detection circuit further comprises a demodulator,
   the output end of each of the P detection sub-circuits is connected with the demodulator.

10. The display according to claim 9, wherein each detection sub-circuit comprises:
   a first amplifier, an inverting end of which is connected, via the transistor, with the first output end of the corresponding light receiving sub-circuit, an non-inverting end of which is connected with the second output end of the corresponding light receiving sub-circuit, the non-inverting end of which is further connected with the second control signal line, and an output end of which is connected with the demodulator; and
   a first resistor, one end of which is connected with the inverting end of the first amplifier, and other end of which is connected with the output end of the first amplifier.

11. The display according to claim 10, wherein each of the P detection sub-circuits further comprises a subtractor connected between the output end of the first amplifier and the demodulator to filter out the second drive signal.

12. The display according to claim 11, wherein the subtractor comprises:
   a second resistor one end of which is connected with the output end of the first amplifier;
   a third resistor one end of which is connected with other end of the second resistor and comprises a first node, and other end of which is grounded;
   a four resistor one end of which is connected with the second control signal line;
   a fifth resistor one end of which is connected with other end of the fourth resistor and comprises a second node;
   a second amplifier, an non-inverting end of which is connected with the first node, and an inverting end of which is connected with the second node, and an output end of which is connected with other end of the fifth resistor and the demodulator respectively.

13. The display according to claim 8, wherein each of the light receivers comprises a photosensitive diode, and when each of the P groups of light receiving sub-circuits comprises a plurality of photosensitive diodes, anodes of the plurality of photosensitive diodes are connected together and cathodes of the plurality of photosensitive diodes are connected together.

14. An electronic device comprising a display, the display comprising an optical touch device, wherein the optical touch device comprises:
   a pixel array that comprises a plurality of pixel sub-circuits each of which comprises M first pixels and N second pixels, wherein the N second pixels are used for emitting detection rays with a preset frequency, where M and N are positive integers;
   a light receiving array that comprises a plurality of light receivers corresponding, at a one-to-one basis, to the plurality of pixel sub-circuits, wherein each of the light receivers generates an sensing signal by receiving reflected rays of the detection rays emitted by a corresponding second pixel;
   a detection circuit connected with the plurality of light receivers, for performing touch positioning according to the sensing signal generated by each of the light receivers;
   a first control signal line connected with the M first pixels, the first control signal line driving the M first pixels by outputting a first drive signal; and
   a second control signal line connected with the N second pixels, the second control signal line driving the N second pixels to emit the detection rays with the preset frequency by outputting a second drive signal,
   wherein the plurality of light receivers are divided into P groups of light receiving sub-circuits, each group of light receiving sub-circuits comprises at least one of the light receivers, and each group of light receiving sub-circuits comprises a first output end and a second output end, where P is an integer greater than 1, wherein the detection circuit comprises P detection sub-circuits, each of which is connected, via a transistor, with a corresponding light receiving sub-circuit in the P groups of light receiving sub-circuits, wherein each of the P detection sub-circuits comprises a first input end, a second input end and an output end, wherein the first input end of each of the P detection sub-circuits is connected, via the transistor, with the first output end of the corresponding light receiving sub-circuit, and wherein the second input end of each of the P detection sub-circuits is connected with the second output end of the corresponding light receiving sub-circuit, and the second input end of each of the P detection sub-circuits is further connected with the second control signal line.

* * * * *